(12) United States Patent
Yang

(10) Patent No.: US 10,236,250 B2
(45) Date of Patent: *Mar. 19, 2019

(54) METHOD FOR PROVIDING ELECTRICAL ANTIFUSE INCLUDING PHASE CHANGE MATERIAL

(71) Applicant: INTERNATIONAL BUSINESS MACHINES CORPORATION, Armonk, NY (US)

(72) Inventor: Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/712,912

(22) Filed: Sep. 22, 2017

(65) Prior Publication Data
US 2018/0025981 A1    Jan. 25, 2018

Related U.S. Application Data

(60) Continuation of application No. 15/432,342, filed on Feb. 14, 2017, now Pat. No. 9,899,318, which is a
(Continued)

(51) Int. Cl.
*H01L 23/52* (2006.01)
*H01L 23/525* (2006.01)
*H01L 23/532* (2006.01)

(52) U.S. Cl.
CPC .... *H01L 23/5252* (2013.01); *H01L 23/53257* (2013.01); *H01L 23/53266* (2013.01);
(Continued)

(58) Field of Classification Search
CPC ..... H01L 23/52; H01L 23/522; H01L 23/525; H01L 23/5252; H01L 21/76879; H01L 21/76886
See application file for complete search history.

(56) References Cited

U.S. PATENT DOCUMENTS

| 5,572,062 A | 11/1996 | Iranmanesh |
| 5,789,764 A | 8/1998 | McCollum |
(Continued)

FOREIGN PATENT DOCUMENTS

| CN | 101887883 B | 12/2011 |
| CN | 103151332 B | 1/2016 |

OTHER PUBLICATIONS

List of IBM Patents or Patent Applications Treated as Related dated Sep. 22, 2017, 2 pages.
(Continued)

*Primary Examiner* — Scott B Geyer
(74) *Attorney, Agent, or Firm* — Tutunjian & Bitetto, P.C.; Vazken Alexanian

(57) ABSTRACT

An antifuse structure including a first electrode that is present in at a base of the opening in the dielectric material. The antifuse structure further includes an antifuse material layer comprising a phase change material alloy of tantalum and nitrogen. A first surface of the antifuse material layer is present in direct contact with the first electrode. A second electrode is present in direct contact with a second surface of the antifuse material layer that is opposite the first surface of the antifuse material layer.

20 Claims, 8 Drawing Sheets

Related U.S. Application Data division of application No. 15/214,884, filed on Jul. 20, 2016, now Pat. No. 9,793,207.

(52) U.S. Cl.
CPC .. *H01L 23/53209* (2013.01); *H01L 23/53223* (2013.01); *H01L 23/53238* (2013.01)

(56) References Cited

U.S. PATENT DOCUMENTS

| | | | |
|---|---|---|---|
| 5,789,795 | A | 8/1998 | Sanchez et al. |
| 5,962,815 | A | 10/1999 | Lan et al. |
| 6,015,997 | A | 1/2000 | Hu et al. |
| 6,124,194 | A | 9/2000 | Shao et al. |
| 6,251,710 | B1 | 6/2001 | Radens et al. |
| 6,335,228 | B1 | 1/2002 | Fuller et al. |
| 6,603,142 | B1 | 8/2003 | Ranaweera et al. |
| 6,713,369 | B1 | 3/2004 | Ranaweera et al. |
| 7,390,726 | B1 | 6/2008 | Issaq et al. |
| 7,394,088 | B2 | 7/2008 | Lung |
| 7,867,889 | B2 | 1/2011 | Besling |
| 8,243,506 | B2 | 8/2012 | Liu |
| 9,305,973 | B2 | 4/2016 | Chung |
| 9,899,318 | B2 * | 2/2018 | Yang ................... H01L 23/5252 |
| 2008/0144355 | A1 | 5/2008 | Boeve et al. |
| 2013/0141967 | A1 | 6/2013 | Cho et al. |

OTHER PUBLICATIONS

Disclosed Anonymously, "PCM Based Anitfuse" IP.com No. IPCOM000229258D (Jul. 17, 2013) pp. 1-6.

U.S. Office Action issued in U.S. Appl. No. 15/703,279, dated Feb. 28, 2018, pp. 1-18.

* cited by examiner

METHOD FOR PROVIDING ELECTRICAL ANTIFUSE INCLUDING PHASE CHANGE MATERIAL

BACKGROUND

Technical Field

The present disclosure relates to antifuse structures, and more particularly to antifuse structures including materials in which the resistance of the material may be adjusted.

Description of the Related Art

Antifuse structures have been used in the semiconductor industry for memory related applications such as, for example, field programmable gate arrays and programmable read-only memories. Most existing antifuse structures have a layer of antifuse material sandwiched in between two disconnected conductive materials. In such structures, the antifuse structure/circuit initially has a very high resistance, but after programming by electrical or optical means, the high resistance structure/circuit is converted to a lower resistance state.

SUMMARY

In one aspect, the present disclosure provides an antifuse structure that includes an antifuse material layer composed of an alloy of tantalum and nitrogen that changes from an insulating phase to an electrically conductive phase in response to thermal heating. In one embodiment, the antifuse structure may include a first electrically conductive material that is present within an opening in a dielectric material, and an antifuse material layer present within the opening in the dielectric. The antifuse material layer may include a phase change material alloy of tantalum and nitrogen. At least one surface of the antifuse material layer is present in direct contact with the first electrically conductive material. A second electrically conductive material is present in direct contact with at least the antifuse material layer. The second electrically conductive material is also present over the opening.

In another aspect of the present disclosure, an electrical device is provided including an antifuse structure composed of an antifuse material layer of an alloy of tantalum and nitrogen that changes from an insulating phase to an electrically conductive phase in response to thermal heating. In one embodiment, the antifuse structure includes a dielectric layer atop an electrical device, wherein an opening extends through the dielectric layer to a contact surface of the electrical device. In some embodiments, a diffusion barrier may be present on sidewalls and a base of the opening. An antifuse material layer may be present within the opening in the dielectric layer. In some embodiments, the antifuse material layer is composed of a phase change material alloy of tantalum and nitrogen. The antifuse material layer may fill an entirety of the opening. An electrically conductive material is present in direct contact with at least the antifuse material layer. The electrically conductive material layer extends over the antifuse material layer and the dielectric layer.

In yet another aspect of the present disclosure, a method of forming an antifuse is provided in which the antifuse structure is composed of an antifuse material layer of an alloy of tantalum and nitrogen that changes from an insulating phase to an electrically conductive phase in response to thermal heating. In one embodiment, the method includes forming at least one opening through a dielectric layer that extends to a contact for an electrical device. An antifuse material layer is then formed comprising a phase change material alloy of tantalum and nitrogen. The antifuse material layer fills at least a portion of the opening. The phase change material may be programmed thermally.

In another aspect of the present disclosure, a method of programming an antifuse structure is provided that includes providing an antifuse material layer including a phase change material alloy of tantalum and nitrogen in an opening through a dielectric layer to an electrical device. The phase change material alloy is formed with an insulating phase in an unprogrammed state. The antifuse material layer is contacted with an electrically conductive metal at a surface of the antifuse material layer that is opposite a surface of the antifuse material layer that is contacting the electrical device. The antifuse material may be thermally heated through the electrically conductive metal. Thermally heating the antifuse material changes crystal structure (and accordingly changes a nitrogen (N) to tantalum (Ta) ratio) in the antifuse material layer to provide electrical conductivity.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1A:
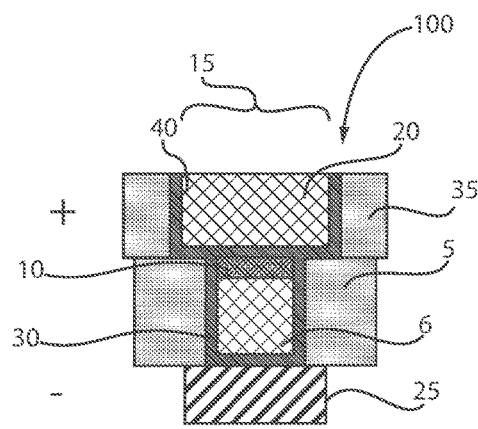
FIG. 1A is a side cross-sectional view depicting one embodiment of an antifuse structure including an antifuse material layer of a phase change alloy including tantalum and nitrogen that is present within an opening extending through a dielectric layer, wherein the antifuse material layer is underlying an electrically conductive material layer that extends over the opening and the antifuse material layer is present atop another electrically conductive material layer that is present within the opening, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The present disclosure provides an antifuse structure, and methods of forming an antifuse structure devices including material layers that exhibit changes in resistivity that correspond to phase changes. An "antifuse" is an electrical device that performs the opposite function to a fuse. Whereas a fuse starts with a low resistance and is designed to permanently break an electrically conductive path (typically when the current through the path exceeds a specified limit), an antifuse starts with a high resistance and can be designed to permanently create an electrically conductive path (typically when the voltage across the antifuse exceeds a certain level). Antifuse structures include a material which initially has a high resistance but can be converted into a lower resistance by the application of a certain process. An un-programmed antifuse type gate array is programmed by causing a selected antifuse to become conductive.

It has been determined that the process for integrating antifuse structures with other devices in an integrated circuit typically requires extra masking and etching steps, which increases overall fabrication costs. It has also been determined that since the programming voltage for creating the electrical path in the antifuse is a function of the thickness of the antifuse layer, damage that is caused to the antifuse material resulting from over etch processes can result in de-programming states, which can result in product failure, i.e., the electrical path is not properly formed when the appropriate voltage is applied. Moreover, the voltage programming method requires a stacked multilayered structure in which a layer of antifuse material is positioned between two "disconnected" conductive materials in an orientation that may be referred to as "sandwiched". It has been determined that this geometry limits design flexability and enlarges the area required for forming the antifuse material element.

In some embodiments, the methods and structures disclosed herein reduce manufacturing complexity of antifuse structures by providing antifuse structures without extra layers of antifuse materials. In some embodiments, the methods and structures disclosed herein include an antifuse material layer that is composed of an alloy of tantalum (Ta) and nitrogen (N). For example, the alloy of tantalum (Ta) and nitrogen (N) that may provide the antifuse material may be composed of tantalum nitride ($Ta_3N_5$). The alloys employed herein for the antifuse material are phase change materials. More specifically, the tantalum (Ta) and nitrogen (N) alloy that provides the antifuse material layer disclosed herein, is typically deposited at a phase that provides insulating properties, which provides the state of the antifuse before programming. Programming of the antifuse may include heating the antifuse material, e.g., by heating the surrounding electrodes, which can cause a phase change in the tantalum (Ta) and nitrogen (N) alloy to a higher conductivity phase. For example, while the $Ta_3N_5$ phase of the tantalum (Ta) and nitrogen (N) alloy has a high resistance typical of an insulator, the TaN phase of the tantalum (Ta) and nitrogen (N) alloy has a lower resistance typical of an electrical conductor. The $Ta_3N_5$ phase of the tantalum (Ta) and nitrogen (N) alloy may be referred to as an orthorhombic phase, which may be considered as a dielectric material. The TaN phase of the tantalum (Ta) and nitrogen (N) alloy may be referred to as a cubic or hexagonal phase, and may be considered an electrical conductor. Electrically conductive" and/or "electrical conductor" as used through the present disclosure means a material typically having a room temperature resistivity less than about 250 µΩ-cm. As used herein, the terms "insulator" and "dielectric" denote a material having a room temperature resistivity greater than about 250 µΩ-cm. The phase change from the insulating phases to the electrically conductive phases is induced by crystal structure change through heating. The conductivity of the anti-fuse element can be increased by changing phase of the tantalum (Ta) and nitrogen (N) alloy, e.g., cubic, hexagonal, through heating, e.g., by heating the conductive materials contacting the antifuse material, i.e., the antifuse material of tantalum (Ta) and nitrogen (N) alloy. The methods and structures of the present disclosure are now described with greater detail referring to FIGS. 1A-10.

FIG. 1A depicts one embodiment of an antifuse structure 100 including an antifuse material layer 10 of a phase change alloy including tantalum and nitrogen that is present within an opening 15 extending through a dielectric layer 5. In some embodiments, the dielectric layer 5 is an interlevel dielectric layer that is present overlying a contact surface 25 to an electrical device, such as a semiconductor device, e.g., field effect transistor (FET), fin type field effect transistor (FinFET), metal oxide semiconductor field effect transistor (MOSFET), bipolar junction transistor, vertical finFET (V-FinFET); memory device, e.g., dynamic random access memory (DRAM), embedded dynamic random access memory (eDRAM), flash memory; and/or passive electronic devices, such as resistors and capacitors. In some examples, the contact surface 25 may be a gate structure or a source/drain region of a semiconductor device. The contact surface 25 may be any active region of a substrate to a semiconductor device. The opening 15 extends through the dielectric layer 5 to a portion of the contact surface 25 of the electronic device.

In some embodiments, a diffusion barrier layer 30 (also referred to as first diffusion barrier layer 30) is present on the sidewalls of the opening 15 that is extending through the dielectric layer 5. The first diffusion barrier layer 30 may composed of a material composition that obstructs the materials that are contained within the opening 15 from diffusing into the dielectric layer 5. For example, the first diffusion barrier layer 30 may be composed of tantalum nitride (TaN). In other examples, the first diffusion barrier layer 30 may be composed of Co, Ir, Rh, Pt, Pd, Ta, TaN, Ti, TiN, Ru, RuN, RuTa, RuTaN, W, WN and combinations thereof. In some embodiment, the diffusion barrier layer 30 may have a conformal thickness ranging from 1 nm to 10 nm.

The antifuse material layer 10 of the phase change alloy including tantalum (Ta) and nitrogen (N) is present entirely within the opening 15, and does not extend outside the opening 15. The antifuse material layer 10 is also a single layer, and not a multilayered structure. The single layer has a single composition of a tantalum (Ta) and nitrogen (N) alloy. By "phase change alloy" it is meant that the composition of the material layer can experience a change in phase from an electrically insulating phase to an electrically conductive phase. In some embodiments, the phase change may be induced thermally, e.g., by directly heating the phase change alloy. In some embodiment, the antifuse material layer 10 of the phase change alloy including tantalum (Ta) and nitrogen (N) is in a dielectric phase before programming. The dielectric phase of the antifuse material layer 10 of the phase change alloy including tantalum (Ta) and nitrogen (N) may be $Ta_3N_5$, which may be referred to as a dielectric material layer. When the alloy including tantalum (Ta) and nitrogen (N) is in a dielectric phase, e.g., when the alloy composition is $Ta_3N_5$, the crystal structure of the tantalum (Ta) and nitrogen (N) alloy may be orthorhombic, which can be considered a dielectric material. As will be described in greater detail below, in response to the application of heat, the antifuse material layer 10 of the phase change alloy including tantalum (Ta) and nitrogen (N) may be converted into an electrically conductive phase. The conversion to the electrically conductive phase may be referred to as programming. When programmed, the crystal structure of the antifuse material layer 10 of the phase change alloy including tantalum (Ta) and nitrogen (N) is changed, e.g., Cubic, hexagonal. TaN. TaN is electrically conductive, and may have a cubic or hexagonal phase. The antifuse material layer 10 may be a single composition material layer that extends the entire width of the opening 15, and may directly contact the diffusion barrier 30 that is present on the sidewalls of the dielectric layer 5.

In the embodiment that is depicted in FIG. 1A, the antifuse material layer 10 of a phase change alloy including tantalum (Ta) and nitrogen (N) includes at least one surface that is present in direct contact with an electrically conductive material 6 (also referred to as a first electrically conductive material 6) that is also present within the opening 15. In some embodiments, the first electrically conductive material 6 is present at the base of the opening 15 abutting the contact surface 25, and the antifuse material layer 10 is present in the upper portion of the opening 15. In this embodiment, the first electrically conductive material 6 is present as a layer in the lower portion of the opening 15 separating the antifuse material layer 10 from the contact surface 25 to the electrical device. The first electrically conductive material 6 may be a single composition material layer that extends the entire width of the opening 15, and may directly contact the diffusion barrier 30 that is present on the sidewalls of the dielectric layer 5. The first electrically conductive material 6 may be composed of a metal selected from copper (Cu), tungsten (W), aluminum (Al), cobalt (Co), rhodium (Rh), ruthenium (Ru), iridium (Ir), nickel (Ni) and combinations thereof. In some embodiments, the first electrically conductive material 6 may be used to thermally heat the antifuse material layer 10 of a phase change alloy including tantalum (Ta) and nitrogen (N) to effectuate a phase change as required by device programming.

Still referring to FIG. 1A, in some embodiments, a metal line including an electrically conductive material 20 (also referred to as second electrically conductive material 20) is present atop the opening 15 including the antifuse material layer 10. The second electrically conductive material 20 is similar to the first electrically conductive material 6. Therefore, the above description of the composition of the first electrically conductive material 6 is suitable for describing the composition of the second electrically conductive material 20. In some embodiments, the second electrically conductive material 20 in direct contact with at least the antifuse material layer 10. Similar to the first electrically conductive material 6, the second electrically conductive material 20 may be employed to thermally heat the antifuse material layer 10 to cause the phase change from the dielectric phase of the material to the electrically conductive phase of the material.

The metal line may be present in an trench that is formed in a second dielectric layer 35. In some embodiments, a diffusion barrier layer 40 (also referred as second diffusion barrier layer 40) is present between the second electrically conductive material 20 for the metal line and the dielectric layer 35 that the trench for the metal line is formed in. The second diffusion barrier 40 is a conformal layer present on the sidewalls and base of the opening in the dielectric layer 35 for the metal line. In some embodiments, the second diffusion barrier 40 has a thickness ranging from 2 nm to 10 nm. In some examples, the second diffusion barrier layer 40 may be composed of Co, Ir, Rh, Pt, Pd, Ta, TaN, Ti, TiN, Ru, RuN, RuTa, RuTaN, W, WN and combinations thereof.

In some embodiments, the antifuse structure depicted in FIG. 1A includes a first electrically conductive material 6 that extends across an entirety of a width of the opening in the dielectric contacting the first diffusion barrier 30 on each of the sidewalls of said opening 15, and wherein the phase change material alloy is present directly atop a first electrically conductive material 6 and across said entirety of said width of said opening in the dielectric 5 contacting the first diffusion barrier 30 on each of the sidewalls of said opening 15. The first electrically conductive material 6 that is contained within the opening 15 containing the antifuse material layer 10 is entirely separated from the second electrically conductive material 20 that provides the metal by the phase change material alloy that provides the active element of the antifuse structure.

Figure 1B:
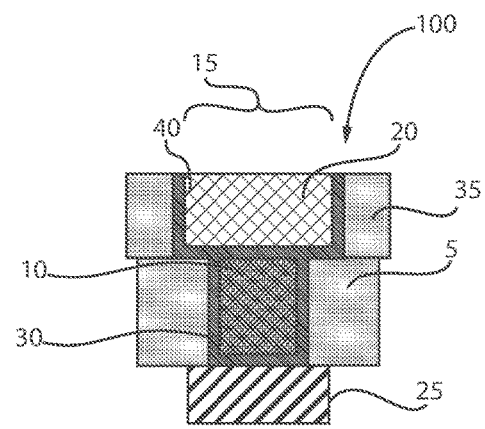
FIG. 1B is a side cross-sectional view depicting another embodiment of an antifuse structure including an antifuse material layer of a phase change alloy including tantalum and nitrogen that is present filling the entirety of the opening extending through a dielectric layer, in accordance with one embodiment of the present disclosure.

FIG. 1B depicts another embodiment of the present disclosure. In FIG. 1B, the antifuse material layer 10 of a phase change alloy including tantalum (Ta) and nitrogen (N) fills the entirety of the opening 15 through the dielectric layer 5 substantially to the contact surface 25 of electrical device that the antifuse structure is in connection with, i.e., to the diffusion barrier layer 30 present on the contact surface 25. The antifuse material layer 10 depicted in FIG. 1B has been described above with reference to FIG. 1A. In the embodiment that is depicted in FIG. 1B, the first electrically conductive material 6 that is depicted in FIG. 1A is removed.

In one embodiment, the device depicted in FIG. 1B includes a dielectric layer 5, atop an electrical device (depicted as the contact surface 25 for the electrical device), wherein an opening 15 extends through the dielectric layer 5 to a contact surface of the electrical device 25. A first diffusion barrier 30 is present on the sidewalls and a base of the opening 15 that contains the antifuse material layer 10. An electrically conductive material 20 (also referred to as second electrically conductive material 20) that can provide a metal line is present in direct contact with at least the antifuse material layer 10. The electrically conductive material layer 20 extends over the antifuse material layer 10 and the dielectric layer 5. It is noted that the first diffusion barrier layer 30, the contact surface 25, dielectric layer 5 and the electrically conductive material 20 (second electrically conductive material) that are depicted in FIG. 1B have been described above in the description of the structures depicted in FIG. 1A having the same reference numbers. Still referring to FIG. 1B, the antifuse structure may further include a second dielectric layer 35 and second diffusion barrier 40, which have also been describe above in FIG. 1A.

Figure 2A:
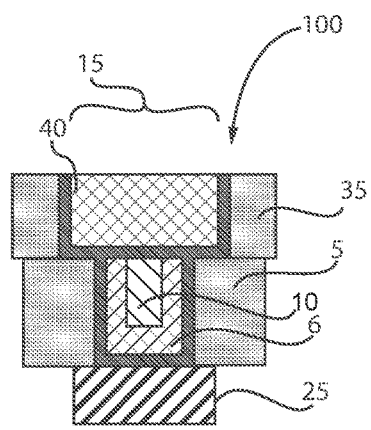
FIG. 2A is a side cross-sectional view depicting another embodiment of an antifuse structure, in which the antifuse material of the phase change alloy including tantalum and nitrogen is present centrally positioned within the opening extending through the dielectric layer, wherein the antifuse material is substantially surrounded by an electrically conductive material present between the sidewalls of the opening and the centrally positioned antifuse material as well as a portion of the electrically conductive material that is present at the base of the opening, in accordance with one embodiment of the present disclosure.

FIG. 2A is a side cross-sectional view depicting another embodiment of an antifuse structure 100, in which the antifuse material 10 of the phase change alloy including tantalum and nitrogen is present centrally positioned within the opening 15 extending through the dielectric layer 5. In the embodiment depicted in FIG. 2A, the antifuse material 10 is substantially surrounded by an electrically conductive material 6 (also referred to as first electrically conductive material 6) present between the sidewalls of the opening 15 and the centrally positioned antifuse material 10, as well as a portion of the first electrically conductive material 6 that is present at the base of the opening 15. The antifuse material 10 of the phase change alloy including tantalum and nitrogen is similar to the antifuse material layer 10 of the phase change alloy including tantalum (Ta) and nitrogen (N) that is described with reference to FIGS. 1A and 1B. Therefore, the above description of the antifuse material layer 10 of the phase change alloy including tantalum (Ta) and nitrogen (N) that is described with reference to FIGS. 1A and 1B is suitable for describing the centrally positioned antifuse material 10 that is depicted in FIG. 2A. For example, the centrally positioned antifuse material 10 may be in a dielectric phase of $Ta_3N_5$ when the antifuse structure has not been programmed, wherein programming may include heating the antifuse material 10 to effectuate a phase change to an electrically conductive phase, in which crystal phase of the centrally positioned antifuse material 10 is cubic, hexagonal, e.g., TaN.

The electrically conductive material 6 (also referred to as first electrically conductive material 6) that is depicted in FIG. 2A is similar to the electrically conductive material 6 that is described above with reference to FIGS. 1A and 1B.

For example, the electrically conductive material 6 may be composed of a metal selected from copper (Cu), tungsten (W), aluminum (Al) cobalt (Co), rhodium (Rh), ruthenium (Ru), iridium (Ir), nickel (Ni) and combinations thereof. Further, similar to the embodiments described above with reference to FIGS. 1 and 2, the electrically conductive material 6 may be employed to heat the centrally positioned antifuse material 10 to program the antifuse structure. As described above, programming the antifuse structure may include heating the centrally positioned antifuse material 10 to cause a phase change from an insulating/dielectric phase, e.g., $Ta_3N_5$, to an electrically conductive phase, e.g., TaN, of the centrally positioned antifuse material 10.

In some embodiments of the antifuse structure that is depicted in FIG. 2A, the portions of the first electrically conductive material 6 on the sidewalls of the opening are perpendicularly orientated with respect to the underlying contact surface 25. By "perpendicularly orientated" it is meant that the inner and outer sidewalls of the first electrically conductive material that separate the centrally positioned portion of the antifuse material 10 from the dielectric 5 are along a plane that intersects with the upper surface of the underlying contact surface 25 at an angle of substantially 90°, e.g., 90°+/−5°. This is differentiate from other embodiments of the present disclosure having tapered portions of the first electrically conductive material 6 on the sidewalls of the opening 15, as later described with reference to FIGS. 3A and 3B. In the embodiment depicted in FIG. 2A, the centrally positioned portion of the antifuse material 10 does not extend through the entire height of the opening 15 through the dielectric layer 5.

In some embodiments, the width of the first electrically conductive material on the sidewalls of the opening 15 ranges from 2 nm to 25 nm. In some further embodiments, the width of the first electrically conductive material on the sidewalls of the opening 15 ranges from 5 nm to 10 nm. The antifuse material 10 that is centrally positioned extends a partial vertical height of the opening. The portion of the first electrically conductive material 6 present at the base of the opening 15 separating the centrally positioned antifuse material 10 from the contact surface 25 of the underlying electrical device may have a thickness ranging from 2 nm to 25 nm. In some embodiments, the portion of the first electrically conductive material 6 present at the base of the opening 15 may have a thickness ranging from 5 nm to 15 nm.

The antifuse structure depicted in FIG. 2A also includes a metal line composed of an electrically conductive material 20 (second electrically conductive material 20) present within a dielectric layer 35 overlying the opening 15 containing the centrally positioned antifuse material 10. Additionally, in some embodiments, the electrically conductive material 20 further includes diffusion barrier layers 30, 40. It is noted that the diffusion barriers 30, 40, the contact surface 25, interlevel dielectric layer 5 and the electrically conductive material 20 (second electrically conductive material) that are depicted in FIG. 2A have been described above in the description of the structures depicted in FIG. 1A having the same reference numbers.

Figure 2B:
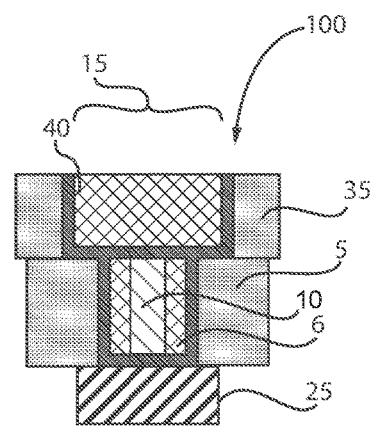
FIG. 2B is a side cross-sectional view depicting another embodiment of the antifuse structure, in which the antifuse material of the phase change alloy that includes tantalum and nitrogen is centrally positioned within an opening extending through the dielectric layer, the antifuse material extending through an entirety of the vertical height of the opening, in accordance with the present disclosure.

FIG. 2B depicts another embodiment of the antifuse structure 100. The antifuse structure 100 depicted in FIG. 2B is similar to the antifuse structure depicted in FIG. 2A with the exception that the antifuse material 10 of the phase change alloy including tantalum and nitrogen is centrally positioned and extends entirely through the vertical height of the opening.

Figure 3A:
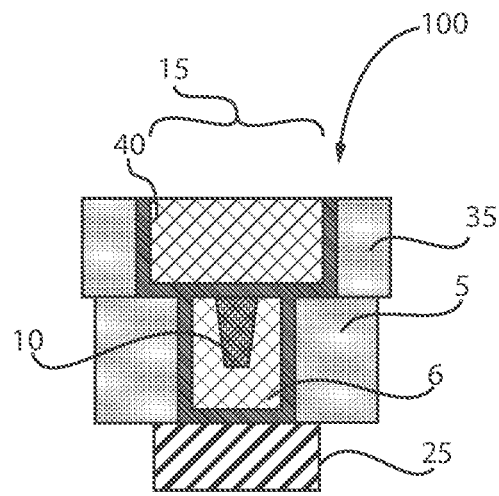
FIG. 3A is a side cross-sectional view depicting one embodiment of an antifuse structure in which the antifuse material of the phase change alloy including tantalum and nitrogen is centrally positioned within an opening in the dielectric layer, and has a tapered sidewall, wherein the antifuse material is substantially surrounded by an electrically conductive material, in accordance with one embodiment of the present disclosure.
Figure 3B:
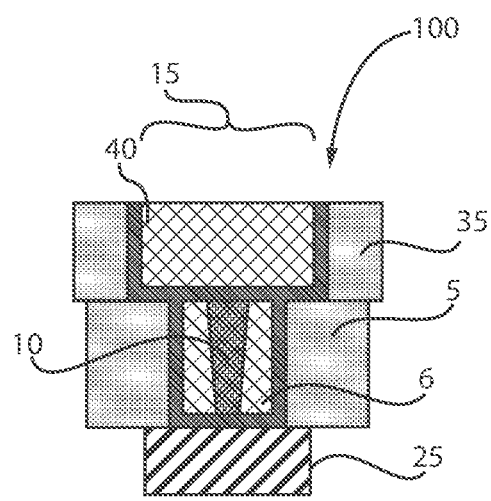
FIG. 3B is a side cross-sectional view depicting one embodiment of an antifuse structure, in which the antifuse material of the phase change alloy of tantalum and nitrogen is centrally positioned within an opening in the dielectric layer that has a tapered sidewall and extends through an entirety of the vertical height of the opening, in accordance with the present disclosure.

FIGS. 3A and 3B depict other embodiments of the present disclosure in which the antifuse material 10 of the phase change alloy is centrally positioned in an opening extending through a dielectric layer 5, and the antifuse material 10 of the phase change alloy has tapered, i.e., angled, sidewalls. In the embodiments depicted in FIGS. 3A and 3B, the antifuse material 10 has tapered sidewalls so that the uppermost surface of the antifuse material 10 that interfaces with the overlying metal line has a width greater than the lowermost surface of the antifuse material 10 that is proximate to the contact surface 25 of the underlying electronic device. The antifuse material 10 of the phase change alloy including tantalum and nitrogen is similar to the antifuse material layer 10 of the phase change alloy including tantalum (Ta) and nitrogen (N) that is described with reference to FIGS. 1A and 1B. Therefore, the above description of the antifuse material layer 10 of the phase change alloy including tantalum (Ta) and nitrogen (N) that is described with reference to FIGS. 1A and 1B is suitable for describing the centrally positioned antifuse material 10 that is depicted in FIGS. 3A and 3B. For example, the centrally positioned antifuse material 10 may be in a dielectric phase of $Ta_3N_5$ when the antifuse structure has not been programmed, wherein programming may include heating the antifuse material 10 to effectuate a phase change to an electrically conductive phase, in which the crystal phase of the centrally positioned antifuse material 10 is cubic, hexagonal, e.g., TaN.

The antifuse structure depicted in FIG. 3A is similar to the antifuse structure depicted in FIG. 2A, in which the antifuse material 10 extends through a partial height of the opening 15, and a portion of a first electrically conductive material 6 separates the antifuse material 10 from the contact surface 25 of the underlying electrical device. The antifuse structure depicted in FIG. 3B is similar to the antifuse structure depicted in FIG. 2B, in which the antifuse material 10 extends through an entirety of the height of the opening 15 into direct contact with the contact surface 25 of the underlying electrical device. The dielectric layers 5, 35, the first and second electrically conductive material 6, 20, and the first and second diffusion barriers 30, 40 that are depicted in FIGS. 3A and 3B have been described above with reference to FIGS. 1A-2B. Some methods for forming the structures depicted in FIGS. 1A and 31B are now discussed in greater detail with reference to FIGS. 4-10.

Figure 4:
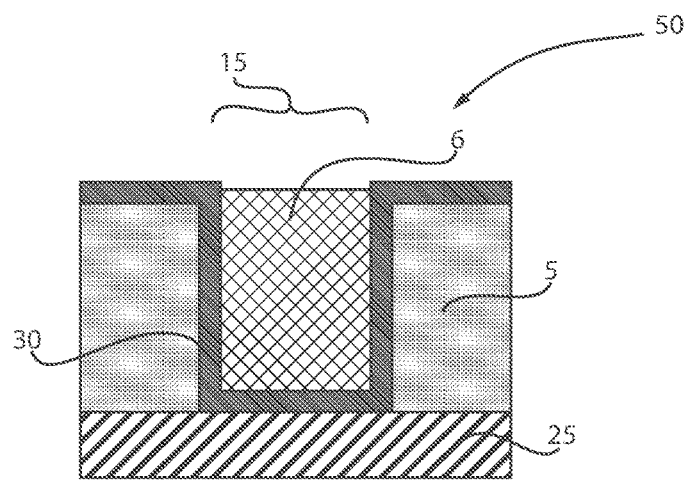
FIG. 4 is a side cross-sectional view of a via contact through a dielectric layer to an electrical device, in accordance with one embodiment of the present disclosure.

FIG. 4 illustrates one embodiment of a via contact 50 through a dielectric layer to an electrical device. The via contact 50 depicted in FIG. 4 can be to any component of an electrical device, such as a semiconductor device, e.g., field effect transistor (FET), fin type field effect transistor (FinFET), metal oxide semiconductor field effect transistor (MOSFET), bipolar junction transistor, vertical finFET (V-FinFET); memory device, e.g., dynamic random access memory (DRAM), embedded dynamic random access memory (eDRAM), flash memory; and/or passive electronic devices, such as resistors and capacitors. The via contact 50 may provide an initial structure for forming an antifuse structure 100. The via contact 50 typically includes an electrically conductive material 6 that is present in a via opening 15 through a dielectric layer 5 that extends to a contact surface 25 of an underlying electronic device. A description for the electrically conductive material 6 has been provided above for the description of the first electrically conductive material 6 that has been described above with reference to FIGS. 1A-3B. The dielectric layer 5 as depicted in FIG. 4 is similar to the dielectric layer 5 that has been described above with reference to FIGS. 1A-3B. In some embodiments, the dielectric layer 5 may be an oxide, nitride or oxynitride material. In other embodiments, the dielectric layer 5 may be a organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), or combinations thereof. The dielectric layer 5 may be formed atop the contact surface 25 of the electrical device using chemical vapor deposition (CVD). Forming the opening 15 through the dielectric layer 5 can include photolithography and etch processes. In some embodiments, a diffusion barrier layer 30 may be formed on the sidewalls and the base of the opening 15 before filling the opening with the electrically conductive material 6. The diffusion barrier layer 30 depicted in FIG. 4 has been described above with reference to FIGS. 1A-3B. The diffusion barrier layer 30 may be deposited using chemical vapor deposition, such as plasma enhanced chemical vapor deposition (PECVD). Following formation of the diffusion barrier layer 30, the remainder of the opening 15 may be filled with the electrically conductive material 6. The electrically conductive material 6 may be deposited using chemical vapor deposition (CVD) or physical vapor deposition (PVD). Examples of CVD suitable for depositing the electrically conductive material 6 include plasma enhanced chemical vapor deposition (PECVD) or metal organic chemical vapor deposition (MOCVD). Examples of PVD suitable for depositing the electrically conductive material may include plating, electroplating, electroless plating, sputtering and combinations thereof.

In some embodiments, after filling the opening 15 with the electrically conductive material 6, the structure may be planarized, e.g., planarized using chemical mechanical planarization (CMP). The via contact 50 depicted in FIG. 4 may be employed as an initial structure for forming the antifuse structures 100 depicted in FIGS. 1A-3B. In some embodiments, the antifuse structures may be integrated into an interlevel dielectric layer 5 that includes also via contacts 50 that are not processed to provide antifuse structures 100, so an interlevel dielectric layer 5 can contain both via contacts 50 and antifuse structures 100 overlying the same substrate, which can include one or multiple electronic devices. To selectively process some of the via contacts 50 for forming the antifuse structures block masks may be employed, such as photoresist masks.

Figure 5A:
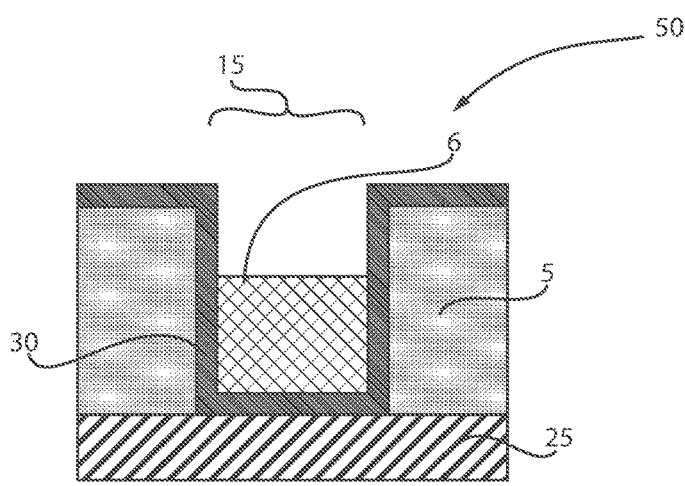
FIG. 5A is a side cross-sectional view of recessing the electrically conductive material of a via contact structure within a via opening through a dielectric layer to an underlying contact to an electrical device, wherein a portion of the electrically conductive material at the base of the via opening remains, in accordance with one embodiment of the present disclosure.

FIG. 5A depicts one embodiment of recessing the electrically conductive material 6 of a via contact structure 50 as depicted in FIG. 4 within a via opening 15 through a dielectric layer 5 to an underlying contact 25 to an electrical device for forming an antifuse structure 100. In the embodiment depicted in FIG. 5A, a portion of the electrically conductive material 6 remains at the base of the via opening 15. The electrically conductive material 6 may be recessed by an etch process. For example, the electrically conductive material 6 may be recessed by an etch process that is selective to the interlevel dielectric 5. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. In some examples, the electrically conductive material 6 may be recessed by an etch process that is also selective to the first diffusion barrier 30. The etch process for recessing the electrically conductive material 6 may be an anisotropic etch process, such as reactive ion etch (RIE). In other embodiments, the etch process for recessing the electrically conductive material 6 may be an isotropic etch, such as a wet chemical etch. Referring to FIG. 5A, in some embodiments, the etch process for recessing the electrically conductive material 6 may be timed to reduce the height of the electrically conductive material 6 by a dimension that provides the thickness of the subsequently deposited antifuse material layer 10 of the phase change alloy including tantalum (Ta) and nitrogen (N) for producing the antifuse structure depicted in FIG. 1A.

Figure 5B:
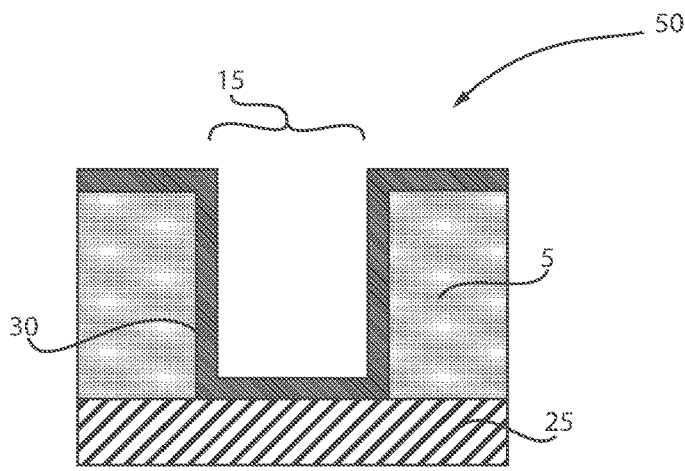
FIG. 5B is a side cross-sectional view of removing the electrically conductive material of a via contact structure within a via opening through a dielectric layer to an underlying contact to an electrical device, in accordance with one embodiment of the present disclosure.

FIG. 5B depicts another embodiment of the present disclosure, in which the entirety of the first electrically conductive material 6 is removed from the via opening 15. In this embodiment, the subsequently deposited antifuse material layer 10 of the phase change alloy including tantalum (Ta) and nitrogen (N) fills the entirety of the via opening 15 to provide the antifuse structure depicted in FIG. 1B. In the embodiment depicted in FIG. 5B, the first electrically conductive material layer 6 may be removed from the via opening 15 using a selective etch that is selective to at least one of the dielectric layer 5, the first diffusion barrier 30 and the contact surface 25 of the underlying electrical device.

Figure 6A:
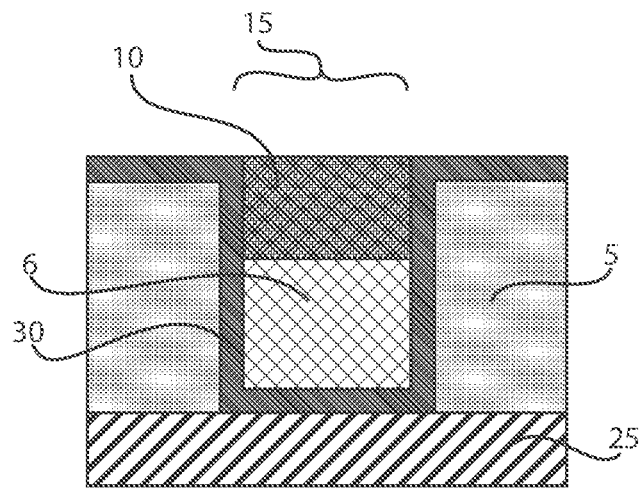
FIG. 6A is a side cross-sectional view of forming an antifuse material layer of a phase change alloy of tantalum and nitrogen in the upper portion of the via opening that is depicted in FIG. 5A.
Figure 6B:
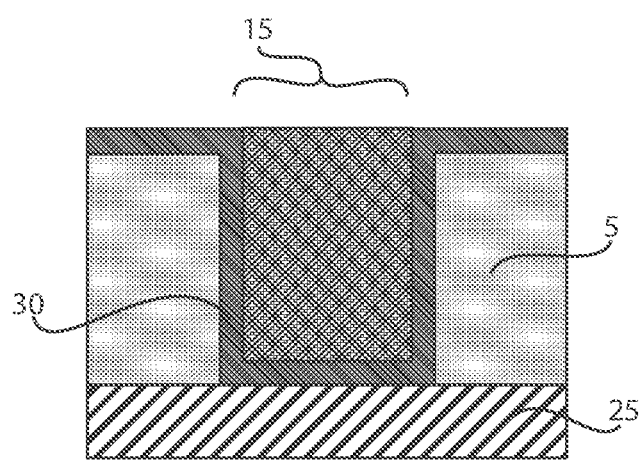
FIG. 6B is a side cross-sectional view of forming an antifuse material layer of a phase change alloy of tantalum and nitrogen, in which the antifuse material layer fills an entirety of the via opening that is depicted in FIG. 5B.

FIGS. 6A and 6B depict one embodiment of forming the antifuse material layer 10. FIG. 6A depicts one embodiment of forming the antifuse material layer 10 of a phase change alloy of tantalum and nitrogen in the upper portion of the via opening that is depicted in FIG. 5A. FIG. 6B depicts forming an antifuse material layer 10 of a phase change alloy of tantalum and nitrogen, in which the antifuse material layer fills an entirety of the via opening 15 that is depicted in FIG. 5B. The antifuse material layer 10 is deposited using a deposition method, such as chemical vapor deposition (CVD) or atomic layer deposition (ALD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may. "Atomic layer deposition" (ALD) as used herein refers to a vapor deposition process in which numerous consecutive deposition cycles are conducted in a deposition chamber. Typically, during each cycle a metal precursor is chemisorbed to the deposition surface; excess precursor is purged out; a subsequent precursor and/or reaction gas is introduced to react with the chemisorbed layer; and excess reaction gas (if used) and by-products are removed. "Chemisorption" and "chemisorbed" as used herein refer to the chemical adsorption of vaporized reactive precursor compounds on the deposition surface. In some examples, the adsorbed species are bound to the deposition surface as a result of relatively strong binding forces characterized by high adsorption energies (>30 kcal/mol), comparable in strength to ordinary chemical bonds. The chemisorbed species can limited to the formation of a monolayer on the deposition surface. In atomic layer deposition, one or more appropriate reactive precursor compounds are alternately introduced (e.g., pulsed) into a deposition chamber and chemisorbed onto the deposition surface. Each sequential introduction of a reactive precursor compound is typically separated by an inert carrier gas purge. Each precursor compound co-reaction adds a new atomic layer to previously deposited layers to form a cumulative solid layer. It should be understood, however, that atomic layer deposition can use one precursor compound and one reaction gas. As compared to the one cycle chemical vapor deposition process, the longer duration multi-cycle atomic layer deposition process allows for improved control of layer thickness by self-limiting layer growth and minimizing detrimental gas phase reactions by separation of the reaction components. Atomic layer deposition is similar in chemistry to chemical vapor deposition, except that the atomic layer deposition reaction breaks the chemical vapor deposition reaction into two half-reactions, keeping the precursor materials separate during the reaction.

In some embodiments, the antifuse material layer 10 of the phase change alloy including tantalum (Ta) and nitrogen (N) is deposited from at temperatures ranging from 200 to 375° C. using atomic layer deposition (ALD) or chemical vapor deposition (CVD). In some embodiments, pentakis (dimethylamino)tantalum (PDMAT) can be used as a tantalum source with either ammonia or monomethylhydrazine (MMH) as a nitrogen co-reactant. In some other embodiments, the tantalum source may be a precursor composed of TBTDMT (Ta($=$NtBu)(NMe$_2$)$_3$) in combination with a nitrogen source provided by N$_2$/H$_2$ (or NH$_3$) plasma or a H$_2$ plasma. In this example the N$_2$/H$_2$ (or NH$_3$) plasma produces an insulating phase, and the H$_2$ plasma produces an electrically conductive phase.

In other embodiments, the tantalum (Ta) source may be composed of Tris(diethylamido)(tert-butylimido) tantalum and hydrazine. The tantalum (Ta) source may also TaCl$_5$ that is employed with a nitrogen source of NH$_3$. In some embodiments employing TaCl$_5$, the precursor gas may be accompanied with a zinc source, trimethylaluminum (TMA) or hydrogen radials to reduce tantalum V to tantalum III. Nitrogen sources may also include tert-butylamine, alylamine, 1,1-dimethylhydrazine and combinations thereof.

In some embodiments, the tantalum (Ta) source may also be provided by pentakis(dimethylamino)tantalum (PDMAT), pentakis(ethylmethylamino) tantalum (PEDMAT), (tert-butylimido)tris(ethylmethylamino)tantalum (TBTMET), (tert-butylimido)tris(diethylamido)tantalum (TBTDET) and combinations thereof.

The antifuse material layer 10 of the phase change alloy including tantalum (Ta) and nitrogen (N) is typically deposited in an insulating/dielectric phase. For example, the antifuse material layer 10 of the phase change alloy including tantalum (Ta) and nitrogen (N) may be deposited having a Ta$_3$N$_5$ composition, which may have an orthorhombic crystalline structure. In other embodiments, the antifuse material layer 10 of the phase change alloy including tantalum (Ta) and nitrogen (N) may be deposited having a Ta$_4$N$_5$ composition, which may have an tetragonal crystalline structure. In some embodiments, the controlling the gas flow of the nitrogen source can provide the preferred stoichiometry. For example, in some embodiments, an antifuse material layer 10 of phase change alloy including tantalum (Ta) and nitrogen (N) may be deposited having a Ta$_3$N$_5$ composition and an orthorhombic crystalline structure, in which the N$_2$ gas flow may range from 500 sccm to 5000 sccm. In some embodiments, the antifuse material layer 10 of phase change alloy including tantalum (Ta) and nitrogen (N) may be deposited having a Ta$_3$N$_5$ composition and an orthorhombic crystalline structure, when the N$_2$ gas flow ranges from 1500 sccm to 3000 sccm. Following deposition of the antifuse material layer 10 of phase change alloy including tantalum (Ta) and nitrogen (N), the structure may be planarized so that the upper surface of the antifuse material 10 is substantially coplanar with the upper surface of the dielectric layer 5.

Figure 7C:
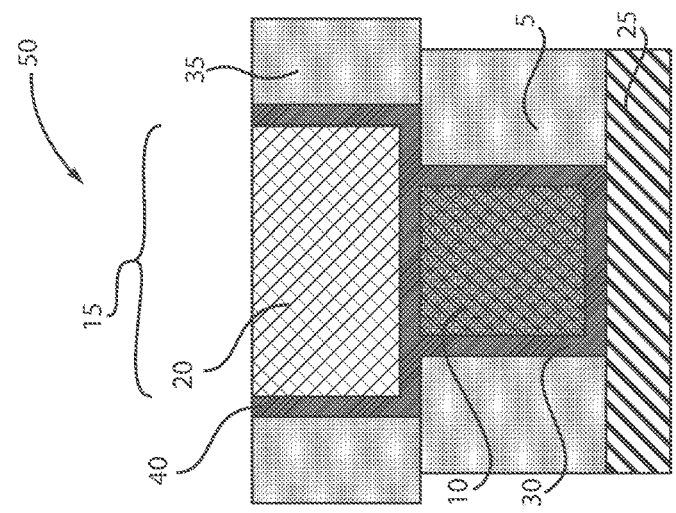
FIG. 7C is a side cross-sectional view depicting forming a metal line atop an antifuse material layer of a phase change material including tantalum and nitrogen that is present in a via opening through a dielectric layer, as depicted in FIG. 6A.
Figure 7B:
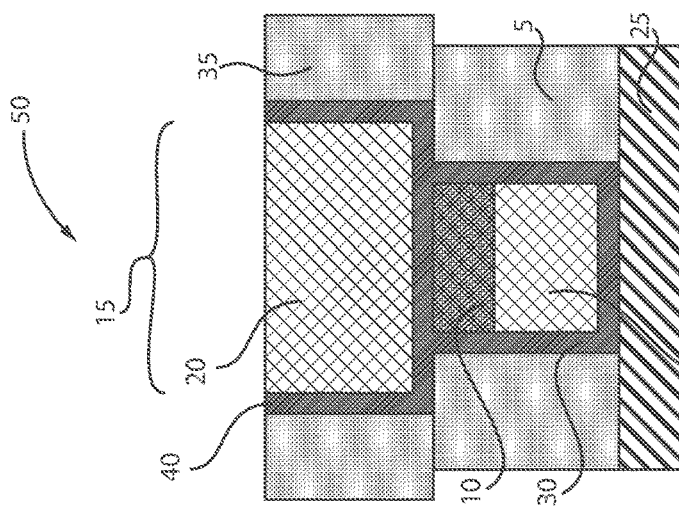
FIG. 7B is a side cross-sectional view depicting forming a metal line atop an antifuse material layer of a phase change material including tantalum and nitrogen that is present in a via opening through a dielectric layer, as depicted in FIG. 6A.
Figure 7A:
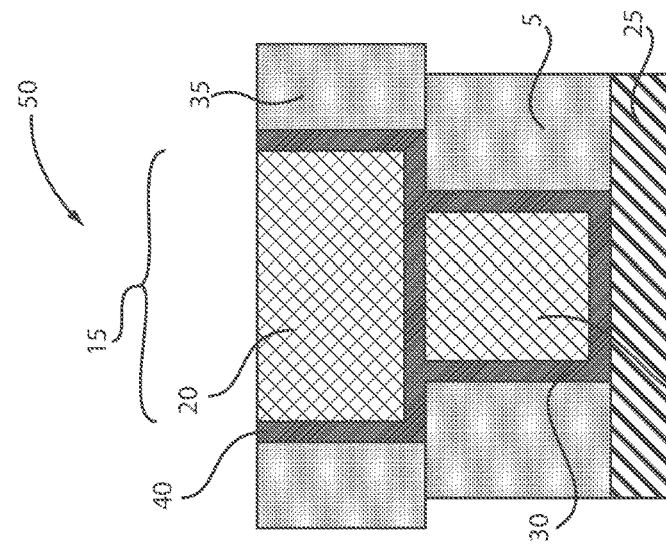
FIG. 7A is a side cross-sectional view depicting forming a metal line, i.e., a layer of an electrically conductive material, atop the via contact depicted in FIG. 4, in accordance with the present disclosure.

FIGS. 7A-7C depict one embodiment of forming a metal line including an electrically conductive material 20 and a diffusion barrier layer 40 in a dielectric layer 35. FIG. 7A depicts forming a metal line, i.e., a layer of an electrically conductive material 20, atop the via contact depicted in FIG. 4. As noted above, the antifuse structures disclosed herein may be integrated with via contacts that share the same dielectric layer 5. FIG. 7B depicts forming a metal line atop an antifuse material layer 10 of a phase change material including tantalum and nitrogen that is present in a via opening through a interlevel dielectric layer 5, as depicted in FIG. 6A. FIG. 7C depicts forming a metal line atop an antifuse material layer 10 of a phase change material including tantalum and nitrogen that is present in a via opening through a dielectric layer, as depicted in FIG. 6B. The metal line may be formed by forming the dielectric layer 35 atop the contact via 50, as depicted in FIG. 4, or antifuse structure, as depicted in FIGS. 6A and 6B. In some embodiments, the dielectric layer 35 may be an oxide, nitride or oxynitride material. In other embodiments, the dielectric layer 35 may be a organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), or combinations thereof. The dielectric layer 35 may be deposited using chemical vapor deposition (CVD). Following forming the dielectric layer 35, trench opening for the metal lines may be patterned and etched in the dielectric layer 35. For example, the trench openings may be formed using photolithography and etch processes. In some embodiments, a diffusion barrier layer 40 may be formed on the sidewalls and the base of the trench openings for the metal lines before filling the opening with the electrically conductive material 20. The diffusion barrier layer 40 depicted in FIG. 4 has been described above with reference to FIGS. 1A-3B. The diffusion barrier layer 40 may be deposited using chemical vapor deposition, such as plasma enhanced chemical vapor deposition (PECVD). Following formation of the diffusion barrier layer 40, the remainder of the trench may be filled with the electrically conductive material 20. The electrically conductive material 20 may be deposited using chemical vapor deposition (CVD) or physical vapor deposition (PVD). Examples of CVD suitable for depositing the electrically conductive material 6 include plasma enhanced chemical vapor deposition (PECVD) or metal organic chemical vapor deposition (MOCVD). Examples of PVD suitable for depositing the electrically conductive material may include plating, electroplating, electroless plating, sputtering and combinations thereof. In some embodiments, after filling the opening 15 with the electrically conductive material 20, the structure may be planarized, e.g., planarized using chemical mechanical planarization (CMP).

Figure 8A:
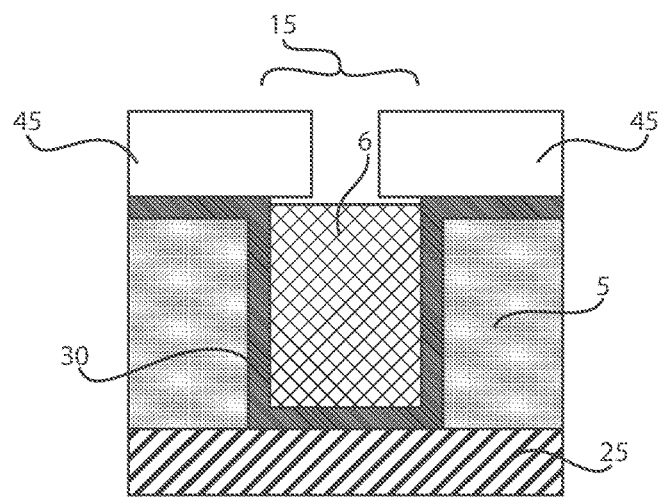
FIG. 8A is a side cross-sectional view depicting forming an etch mask atop a contact via, as depicted in FIG. 4 for forming one of the structures depicted in FIGS. 2A-3B, in accordance with another embodiment of the present disclosure.

FIGS. 8A-10 depict some other embodiments of method for forming antifuse structures 100. The methods described with reference to FIGS. 8A-10 can provide some examples of the antifuse structures depicted in FIGS. 2A-3B. FIG. 8A depicts one embodiment of forming an etch mask 45 atop a contact via, as depicted in FIG. 4 for forming one of the structures depicted in FIGS. 2A-3B. The etch mask 45 may be formed using photolithography. The lithographic process can include forming a photoresist layer atop the electrically conductive material 6, exposing the photoresist to a desired pattern of radiation and developing the exposed photoresist utilizing a conventional resist developer.

Figure 8B:
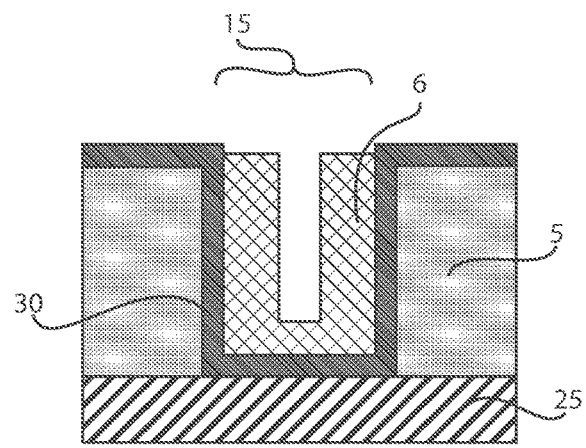
FIG. 8B is a side cross-sectional view depicting one embodiment of etching the electrically conductive material of the via contact depicted in FIG. 8A to provide an antifuse material opening, in which a portion of the electrically conductive material of the via contact remains on sidewalls of the via opening and at the base of the via opening, in accordance with the present disclosure.
Figure 8C:
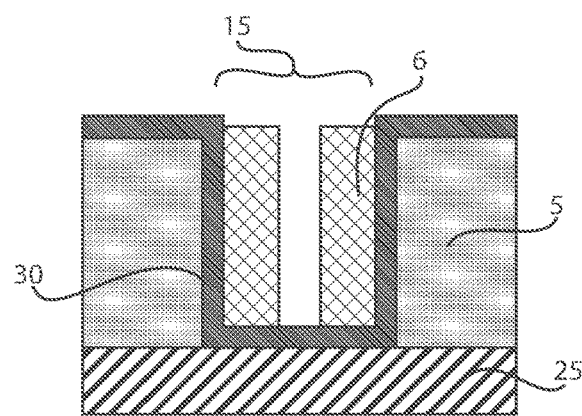
FIG. 8C is a side cross-sectional view depicting one embodiment of etching the electrically conductive material of the via contact depicted in FIG. 8A, in which a portion of the electrically conductive material of the contact remains on sidewalls of the via opening, but the antifuse material opening extends through an entire height of the via opening.
Figure 8D:
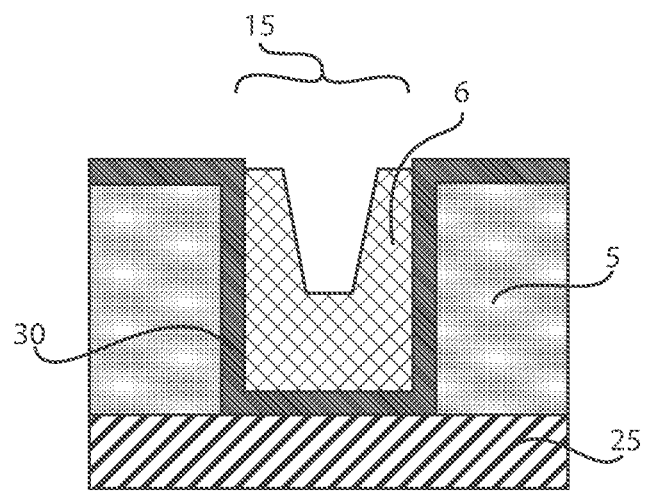
FIG. 8D is a side cross-sectional view depicting one embodiment of etching the electrically conductive material of the via contact depicted in FIG. 8A to provide an antifuse material opening having tapered sidewalls, in which a portion of the electrically conductive material of the via contact remains on sidewalls of the via opening and at the base of the via opening, in accordance with the present disclosure.
Figure 8E:
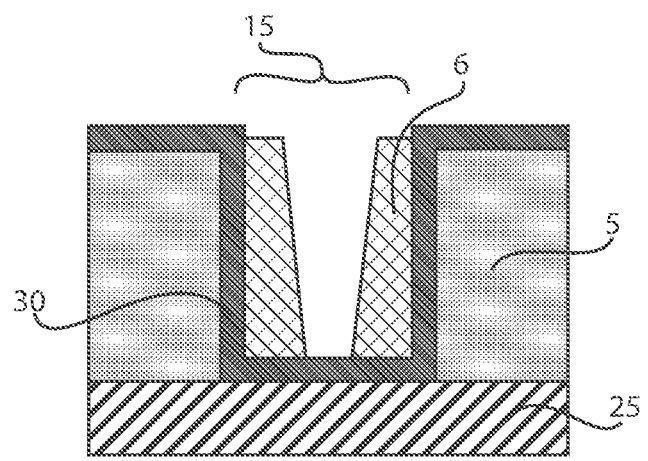
FIG. 8E is a side cross-sectional view depicting one embodiment of etching the electrically conductive material of the via contact depicted in FIG. 8A, in which a portion of the electrically conductive material of the contact remains on sidewalls of the via opening, but the antifuse material opening extends through an entire height of the via opening.

The pattern is then transferred into the electrically conductive material 6 by etching to form an antifuse material opening, as depicted in FIGS. 8B-8E. The etching can include a dry etching process (such as, for example, reactive ion etching, ion beam etching, plasma etching or laser ablation), and/or a wet chemical etching process. For example, in one embodiment, an anisotropic etch process, such as reactive ion etching (RIE), can be used to etch the electrically conductive material within the via opening 15 that is depicted in FIGS. 8B and 8C to provide a centrally positioned antifuse material opening having vertically orientated sidewalls. In another embodiment, a combination of anisotropic and isotropic etch processed may be used to provide a centrally positioned antifuse material opening that is formed in the electrically conductive material 6 having a tapered or angled sidewall, as depicted in FIGS. 8D and 8E. In some embodiments, the etch process may continue to recess a centrally positioned portion of the electrically conductive material 6 that is exposed by the etch mask 45 a partial height of the via opening, as depicted in FIGS. 8B and 8D. In other embodiments, the etch process may continue until the centrally positioned openings extends entirety through the height of the electrically conductive material 6 in the via opening 15, as depicted in FIGS. 8C and 8E. To provide the correct etch depth, the etch process for forming the centrally positioned opening in the electrically conductive material 6 may be timed, or the etch process may employ end point detection techniques. After patterning the underlying electrically conductive material 6, the patterned photoresist can be removed utilizing a conventional stripping process such as, for example, oxygen ashing.

Figure 9:
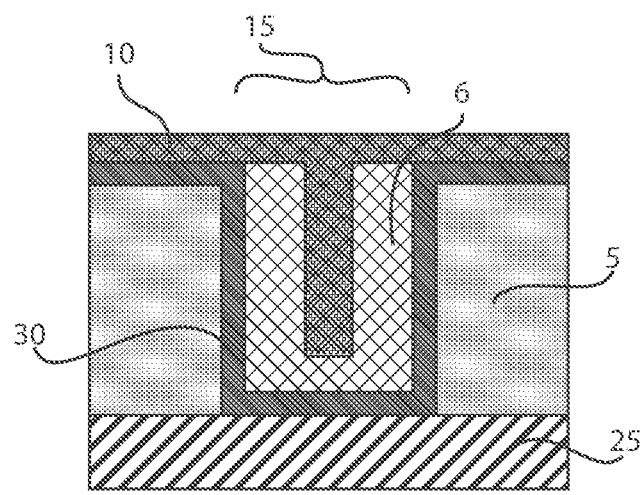
FIG. 9 is a side cross-sectional view depicting forming an antifuse material layer of a phase change alloy of tantalum and nitrogen in the antifuse material opening depicted in FIG. 8B, in accordance with one embodiment of the present disclosure.

The centrally positioned opening is subsequently filled with the antifuse material 10. FIG. 9 depicts one embodiment of forming an antifuse material layer 10 of a phase change alloy of tantalum and nitrogen in the antifuse material opening depicted in FIG. 8B. Although FIG. 9 depicts forming the antifuse material 10 in the antifuse material opening that is depicted in FIG. 8B, the deposition step depicted in FIG. 9 is equally applicable to the other embodiments of the present disclosure that are depicted in FIGS. 8C-8E. The antifuse material 10 that is depicted in FIG. 9 may be formed using a chemical vapor deposition (CVD) or atomic layer deposition (ALD) process, as described above for forming the antifuse material 10 that is depicted in FIGS. 6A and 6B. For example, the antifuse material layer 10 of the phase change alloy including tantalum (Ta) and nitrogen (N) may be deposited in an insulating/dielectric phase. In some embodiments, the antifuse material layer 10 of the phase change alloy including tantalum (Ta) and nitrogen (N) for the antifuse material 10 may be deposited having a $Ta_3N_5$ composition, which may have an orthorhombic crystalline structure. In other embodiments, the antifuse material layer 10 of the phase change alloy including tantalum (Ta) and nitrogen (N) may be deposited having a $Ta_4N_5$ composition, which may have an tetragonal crystalline structure. In some embodiments, the controlling the gas flow of the nitrogen source can provide the preferred stoichiometry. For example, in some embodiments, an antifuse material layer 10 of phase change alloy including tantalum (Ta) and nitrogen (N) may be deposited having a $Ta_3N_5$ composition and an orthorhombic crystalline structure, in which the $N_2$ gas flow may range from 500 sccm to 5000 sccm. In some embodiments, the antifuse material layer 10 of phase change alloy including tantalum (Ta) and nitrogen (N) may be deposited having a $Ta_3N_5$ composition and an orthorhombic crystalline structure, when the $N_2$ gas flow ranges from 1500 sccm to 3000 sccm.

Referring to FIG. 9, in some embodiments, the antifuse material layer 10 may be deposited to fully fill the centrally positioned antifuse material opening that has been formed in the electrically conductive material 6. Typically, the antifuse material layer 10 is deposited to fully fill the centrally positioned antifuse material opening that has been formed in the electrically conductive material 6, in which the antifuse material layer 10 extends onto the upper surface of the dielectric layer 5 on opposing sides of the via opening.

Figure 10:
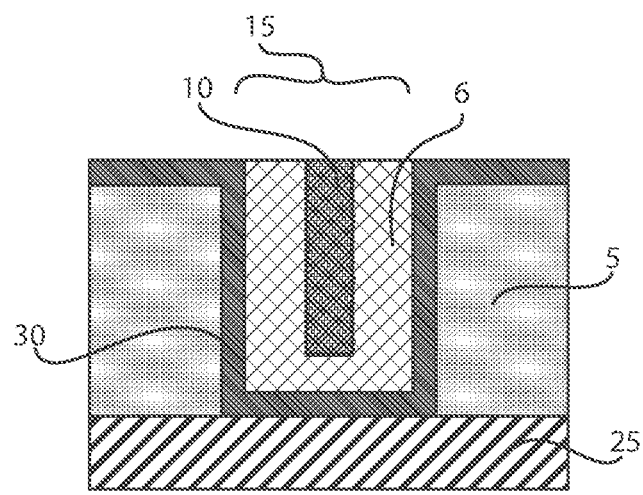
FIG. 10 is a side cross-sectional view depicting planarizing the antifuse material layer depicted in FIG. 9.

Following deposition of the antifuse material layer 10 of phase change alloy including tantalum (Ta) and nitrogen (N), the structure may be planarized so that the upper surface of the antifuse material 10 is substantially coplanar with the upper surface of the dielectric layer 5, as depicted in FIG. 10. The planarization process typically removes the portion of the antifuse material layer 10 that extends over the dielectric layer 5. The planarization process may include chemical mechanical planarization (CMP). Although FIG. 10 depicts planarizing the antifuse material 10 in the antifuse material opening that are formed in accordance with the embodiments consistent with those depicted in FIG. 8B, the planarization step depicted in FIG. 10 is equally applicable to the other embodiments of the present disclosure that are depicted in FIGS. 8C-8E.

Following forming the centrally positioned antifuse material 10, the method may continue with forming a metal line thereon. For example, forming a metal line on the structure depicted in FIG. 10 may provide the antifuse structures that have been described above with reference to FIG. 2A. Forming a metal line on the centrally positioned antifuse material in the antifuse material openings described with reference to FIG. 8C can provide one example of the structure depicted in FIG. 2B. Forming a metal line on the centrally positioned antifuse material in the antifuse material openings described with reference to FIG. 8D can provide one example of the structure depicted in FIG. 3A. Forming a metal line on the centrally positioned antifuse material in the antifuse material openings described with reference to FIG. 8E can provide one example of the structure depicted in FIG. 3B. Forming the metal line may include depositing a dielectric layer 35; patterning the dielectric layer 35 to provide a line trench overlying the via opening 15; forming a diffusing barrier layer 40 on the sidewalls and base of the line trench; and filling the remainder of the line trench with an electrically conductive material 20. Further details for forming the metal line can be found in the above description of the metal line that is described with reference to FIGS. 7A-7C.

In some embodiments, the present disclosure provides a method of programming an antifuse structure 100. The method of programming the antifuse may include providing an antifuse structure 100 as described above with reference to FIGS. 1-10, which includes an antifuse material layer 10 including a phase change material alloy of tantalum and nitrogen in an opening through a dielectric layer to an electrical device. In some embodiments, the phase change material alloy of the antifuse material layer 10 is first formed having an insulating phase. The antifuse material layer 10 is typically contacted with at least one electrically conductive metal 20 at a surface of the antifuse material layer 10 that is opposite a surface of the antifuse material layer that is contacting the electrical device. In some embodiments, a second electrically conductive metal 6 is present between the antifuse material layer 10 and the electrically conductive device. In some embodiments, programming the antifuse material layer 10 may include thermally heating the antifuse material 10 through at least one of the electrically conductive metals 6, 20. Thermally heating the antifuse material layer 10 can change crystal structure (and accordingly change a nitrogen (N) to tantalum (Ta) ratio) in the antifuse material layer 10 to convert the antifuse material layer from its insulating phase to an electrically conductive phase. For example, programming the antifuse structure may include thermally heating the antifuse material layer 10 to cause a phase change from an insulating orthorhombic crystal structure, e.g., $Ta_3N_5$ composition to an electrically conductive cubic or hexagonal crystal structure, e.g., TaN composition. In some embodiments, thermal heating to program the antifuse structure may induce a phase change from an insulating phase to an electrically conductive phase at a temperature ranging from 500° C. to 900° C. In another embodiment, thermal heating to program the antifuse structure may induce a phase change from an insulating phase to an electrically conductive phase at a temperature ranging from 550° C. to 650° C. In one example, thermal heating to program the antifuse structure may induce a phase change from an insulating phase to an electrically conductive phase at a temperature of 600° C.

Having described preferred embodiments of antifuse structures and methods of forming antifuse structures (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming an antifuse:
   forming antifuse material layer comprising a phase change material alloy of tantalum and nitrogen, the phase change material alloy having an orthorhombic phase prior to said antifuse structure being programmed, wherein the phase change material is programmed thermally.

2. The method of claim 1, wherein the phase change material alloy comprises $Ta_3N_5$ before programming, wherein the $Ta_3N_5$ is an insulator.

3. The method of claim 1, wherein forming the antifuse material comprises a chemical vapor deposition (CVD) process.

4. The method of claim 3, wherein the CVD process includes a nitrogen containing gas with a flow rate ranging from 500 sccm to 5000 sccm.

5. The method of claim 1, wherein said programmed thermally comprises heating the antifuse material layer to a temperature ranging from 500° C. to 900° C.

6. The method of claim 1, further comprising an electrically conductive feature in direct contact with the phase change material alloy.

7. The method of claim 6, wherein the electrically conductive feature thermally heats the antifuse material.

8. The method of claim 6, wherein the electrically conductive feature comprises a metal selected from the group consisting of Cu, W, Al, Co, Rh, Ru, Ir, Ni and combinations thereof.

9. The method of claim 6, further comprising forming a diffusion barrier between sidewalls of at least one opening in a dielectric material in which said antifuse material is present, and sidewalls of at least one of said antifuse material layer and said electrically conductive material.

10. The method of claim 9, wherein the diffusion barrier comprises a diffusion barrier metal containing material selected from the group consisting of tantalum nitride (TaN), titanium nitride (TiN), ruthenium (Ru), tungsten nitride (W(N)), RuTa(N), Co, Ru and combinations thereof.

11. The method of claim 10, wherein the electrically conductive material extends across an entirety of a width of said at least one opening in the dielectric contacting said diffusion barrier on each of said sidewalls of said opening, and said phase change material alloy is present directly atop said first conductive material and across said entirety of said width of said at least one opening in the dielectric contacting said diffusion barrier on each of said sidewalls of said at least one opening.

12. The method of claim 11, wherein said phase change material alloy is centrally positioned in at least one opening, and said electrically conductive material includes vertical portions separating said phase change material alloy from said diffusion barrier on said sidewalls of said at least one opening.

13. The method of claim 9, wherein the antifuse material layer that is centrally positioned extends an entire vertical height of the at least one opening.

14. The method of claim 1, wherein the phase change material alloy has electrically conductive properties and a cubic or hexagonal phase following said antifuse structure being programmed.

15. The method of claim 7, wherein the phase change material alloy is TaN.

16. The method of claim 1, wherein the phase change material alloy has electrically conductive properties and a cubic phase following said antifuse structure being programmed.

17. A method of forming an antifuse:
   forming antifuse material layer comprising a phase change material alloy of tantalum and nitrogen, wherein the phase change material is programmed thermally; and
   an electrically conductive feature in direct contact with the phase change material alloy, wherein the electrically conductive feature thermally heats the antifuse material.

18. The method of claim 17, wherein the phase change material alloy comprises $Ta_3N_5$ before programming, wherein the $Ta_3N_5$ is an insulator.

19. The method of claim 17, wherein forming the antifuse material comprises a chemical vapor deposition (CVD) process, wherein the CVD process includes a nitrogen containing gas with a flow rate ranging from 500 sccm to 5000 sccm.

20. The method of claim 17, wherein said programmed thermally comprises heating the antifuse material layer to a temperature ranging from 500° C. to 900° C.

* * * * *